United States Patent
Chang et al.

(10) Patent No.: US 11,264,484 B2
(45) Date of Patent: Mar. 1, 2022

(54) STRUCTURE AND FORMATION METHOD OF SEMICONDUCTOR DEVICE WITH GATE STACK

(71) Applicant: Taiwan Semiconductor Manufacturing Company, Ltd., Hsinchu (TW)

(72) Inventors: Che-Cheng Chang, New Taipei (TW); Sheng-Chi Shih, Toufen Township (TW); Yi-Jen Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/068,537

(22) Filed: Oct. 12, 2020

(65) Prior Publication Data

US 2021/0028296 A1    Jan. 28, 2021

Related U.S. Application Data

(60) Continuation of application No. 16/050,420, filed on Jul. 31, 2018, now Pat. No. 10,804,371, which is a
(Continued)

(51) Int. Cl.
*H01L 29/66* (2006.01)
*H01L 21/3213* (2006.01)
(Continued)

(52) U.S. Cl.
CPC .. *H01L 29/66545* (2013.01); *H01L 21/28114* (2013.01); *H01L 21/28123* (2013.01);
(Continued)

(58) Field of Classification Search
CPC .................................................. H01L 29/66545
See application file for complete search history.

(56) References Cited

U.S. PATENT DOCUMENTS

| 8,421,132 B2 | 4/2013 | Cai et al. |
| 8,541,296 B2 * | 9/2013 | Yang ................. H01L 29/66545 438/589 |

(Continued)

FOREIGN PATENT DOCUMENTS

| CN | 102194874 A | 9/2011 |
| CN | 102347227 A | 2/2012 |

(Continued)

*Primary Examiner* — William A Harriston
(74) *Attorney, Agent, or Firm* — Slater Matsil, LLP (57) ABSTRACT

A structure and a formation method of a semiconductor device are provided. The semiconductor device includes a semiconductor substrate and a first gate electrode over the semiconductor substrate. The semiconductor device also includes a first gate dielectric layer between the first gate electrode and the semiconductor substrate. The semiconductor device further includes a second gate electrode over the semiconductor substrate. The second gate electrode has an upper portion and a lower portion between the upper portion and the semiconductor substrate, and the upper portion is wider than the lower portion. In addition, the semiconductor device includes a second gate dielectric layer between the second gate electrode and the semiconductor substrate.

20 Claims, 10 Drawing Sheets

Related U.S. Application Data division of application No. 14/507,458, filed on Oct. 6, 2014, now Pat. No. 10,164,049.

(51) Int. Cl.
*H01L 21/28* (2006.01)
*H01L 29/423* (2006.01)
*H01L 29/49* (2006.01)
*H01L 29/51* (2006.01)

(52) U.S. Cl.
CPC .. *H01L 21/32137* (2013.01); *H01L 29/42376* (2013.01); *H01L 29/4966* (2013.01); *H01L 29/517* (2013.01)

(56) References Cited

U.S. PATENT DOCUMENTS

| | | | |
|---|---|---|---|
| 9,012,319 B1 | 4/2015 | Choi et al. | |
| 9,627,379 B1* | 4/2017 | Chang | H01L 27/0886 |
| 10,763,258 B2* | 9/2020 | Chang | H01L 21/28114 |
| 2005/0035396 A1 | 2/2005 | Yaegashi | |
| 2006/0063321 A1 | 3/2006 | Sasaki | |
| 2006/0065934 A1 | 3/2006 | Okayama et al. | |
| 2006/0214197 A1 | 9/2006 | Nakamura et al. | |
| 2007/0145455 A1 | 6/2007 | Yasui et al. | |
| 2008/0001230 A1 | 1/2008 | Lee et al. | |
| 2009/0057771 A1* | 3/2009 | Fukasaku | H01L 29/4975 257/369 |
| 2011/0079854 A1* | 4/2011 | Lin | H01L 21/823807 257/365 |
| 2011/0104880 A1 | 5/2011 | Heinrich et al. | |
| 2012/0034747 A1* | 2/2012 | Lin | H01L 29/7833 438/300 |
| 2012/0086056 A1 | 4/2012 | Beyer et al. | |
| 2012/0135594 A1* | 5/2012 | Hong | H01L 29/66545 438/591 |
| 2013/0005128 A1 | 1/2013 | Ng et al. | |
| 2013/0059435 A1 | 3/2013 | Yang et al. | |
| 2013/0065368 A1 | 3/2013 | Yasui et al. | |
| 2013/0149854 A1 | 6/2013 | Ishii et al. | |
| 2013/0178055 A1* | 7/2013 | LaBonte | H01L 21/32134 438/595 |
| 2014/0001559 A1* | 1/2014 | Lin | H01L 29/6681 257/368 |
| 2014/0038376 A1 | 2/2014 | Zhu et al. | |
| 2014/0042553 A1* | 2/2014 | Chiang | H01L 29/42376 257/401 |
| 2014/0191299 A1 | 7/2014 | Wang et al. | |
| 2014/0239367 A1 | 8/2014 | Saito et al. | |
| 2014/0264609 A1 | 9/2014 | Fung | |
| 2014/0273377 A1 | 9/2014 | Kim | |
| 2014/0363960 A1 | 12/2014 | Kim et al. | |
| 2015/0115363 A1 | 4/2015 | Chang et al. | |
| 2017/0053913 A1* | 2/2017 | Min | H01L 27/0886 |
| 2017/0117192 A1* | 4/2017 | Min | H01L 21/82385 |
| 2017/0179117 A1* | 6/2017 | Chang | H01L 21/823437 |
| 2017/0287909 A1 | 10/2017 | Oh et al. | |
| 2018/0102418 A1 | 4/2018 | Bih et al. | |
| 2019/0386115 A1* | 12/2019 | Lin | H01L 21/762 |

FOREIGN PATENT DOCUMENTS

| | | |
|---|---|---|
| CN | 103620748 A | 3/2014 |
| CN | 104051460 A | 9/2014 |
| KR | 1020000048262 A | 7/2000 |
| KR | 1020140002455 A | 1/2014 |
| KR | 1020140090919 A | 7/2014 |

\* cited by examiner

STRUCTURE AND FORMATION METHOD OF SEMICONDUCTOR DEVICE WITH GATE STACK

PRIORITY CLAIM AND CROSS-REFERENCE

This application is a continuation of U.S. application Ser. No. 16/050,420, filed on Jul. 31, 2018, and entitled "Structure and Formation Method of Semiconductor Device with Gate Stack," which is a division of U.S. application Ser. No. 14/507,458, filed on Oct. 6, 2014, and entitled "Structure and Formation Method of Semiconductor Device with Gate Stack," now U.S. Pat. No. 10,164,049 issued on Dec. 25, 2018, which applications are incorporated herein by reference.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. However, these advances have increased the complexity of processing and manufacturing ICs.

Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device, in accordance with some embodiments. Additional operations can be provided before, during, and/or after the stages described in FIGS. 1A-1G, in accordance with some embodiments. Some of the stages described can be replaced or eliminated for different embodiments. Additional features can be added in the semiconductor device. Some of the features described below can be replaced or eliminated for different embodiments.

Figure 1A:
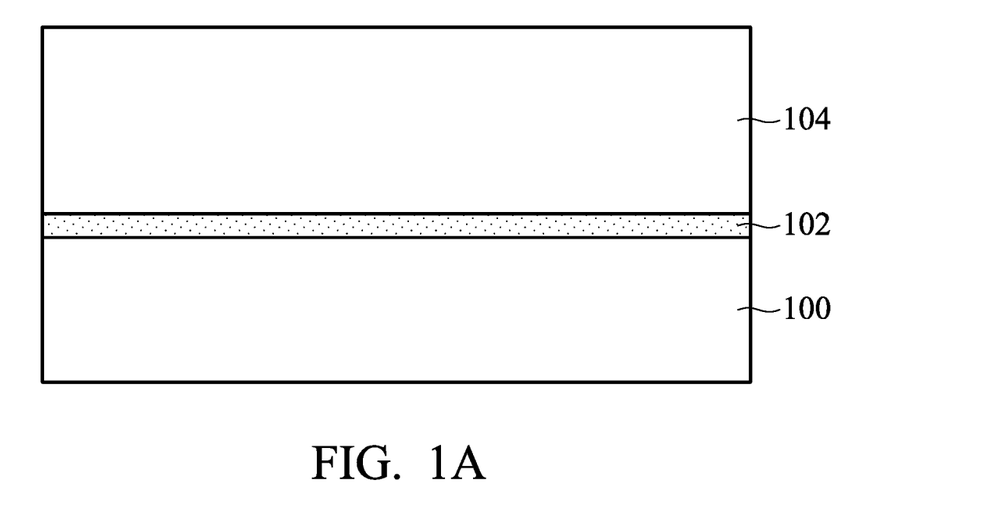
FIGS. 1A-1G are cross-sectional views of various stages of a process for forming a semiconductor device, in accordance with some embodiments.

As shown in FIG. 1A, a semiconductor substrate 100 is provided. In some embodiments, the semiconductor substrate 100 is a bulk semiconductor substrate. The bulk semiconductor substrate may be a semiconductor wafer such as a silicon wafer. In some embodiments, the semiconductor substrate 100 includes an elementary semiconductor material such as silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof.

In some embodiments, the semiconductor substrate 100 is a semiconductor-on-insulator (SOI) substrate. The SOI substrate may be fabricated by using a separation by implantation of oxygen (SIMOX) process, a wafer bonding process, another applicable method, or a combination thereof.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, one or more isolation features (not shown) are formed in the semiconductor substrate 100 to define and isolate various device elements (not shown) formed in the semiconductor substrate 100. The isolation features include, for example, trench isolation (STI) features, local oxidation of silicon (LOCOS) features, another suitable isolation feature, or a combination thereof.

Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

As shown in FIG. 1A, a gate dielectric layer 102 is deposited over the semiconductor substrate 100, in accordance with some embodiments. In some embodiments, the gate dielectric layer 102 is made of silicon oxide, silicon nitride, silicon oxynitride, a dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 102 is a dummy gate dielectric layer which will be replaced with another dielectric material. The dummy gate dielectric layer is, for example, a silicon oxide layer. In some embodiments, the gate dielectric layer 102 is deposited using a chemical vapor deposition (CVD) process, an atomic layer deposition (ALD) process, a thermal oxidation process, another applicable process, or a combination thereof.

As shown in FIG. 1A, a gate electrode layer 104 is deposited over the gate dielectric layer 102, in accordance with some embodiments. In some embodiments, the gate electrode layer 104 includes polysilicon, a metal material, another suitable conductive material, or a combination thereof. In some embodiments, the gate electrode layer 104 is a dummy gate electrode layer and will be replaced with another conductive material such as a metal material. The dummy gate electrode layer is made of, for example, polysilicon. In some embodiments, the gate electrode layer 104 is deposited using a chemical vapor deposition (CVD) process, an atomic layer deposition (ALD) process, another applicable process, or a combination thereof.

Many variations and modifications can be made to embodiments of the disclosure. In some embodiments, the gate electrode layer 104 is a dummy gate electrode layer, and the gate dielectric layer 102 is not formed. In some other embodiments, the gate electrode layer 104 and the gate dielectric layer 102 are formed over semiconductor fins (not shown) formed over the semiconductor substrate 100. The gate electrode layer 104 and the gate dielectric layer 102 are used to form gate stacks of a FinFET device.

In some embodiments, the gate electrode layer 104 and the gate dielectric layer 102 are patterned into multiple gate lines. The gate lines may be substantially parallel to each other. Photolithography and etching processes may be used to form the gate lines. Afterwards, each of the gate lines is further patterned into multiple gate stacks, in accordance with some embodiments. However, it should be appreciated that embodiments of the disclosure are not limited thereto. In some other embodiments, the gate electrode layer 104 and the gate dielectric layer 102 are patterned to form the gate stacks without forming the gate lines in advance.

Figure 1B:
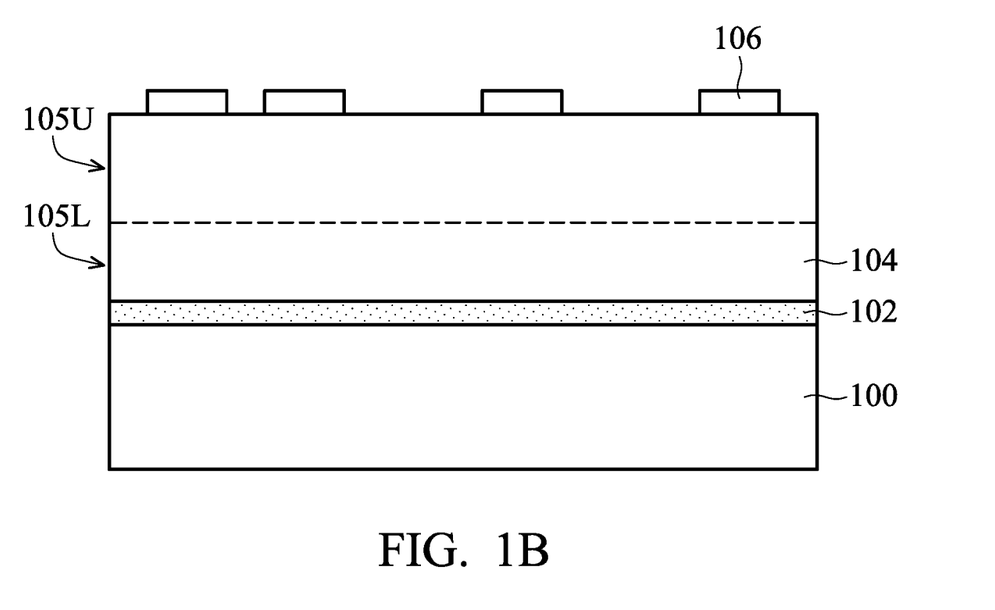

As shown in FIG. 1B, a hard mask 106 is formed over the gate electrode layer 104 to assist in the subsequent patterning process for forming gate stacks, in accordance with some embodiments. In some embodiments, the hard mask 106 is made of silicon oxide, silicon nitride, silicon oxynitride, silicon carbide, another suitable material, or a combination thereof. In some embodiments, the hard mask 106 has a multi-layer structure. In some embodiments, one or more patterned photoresist layers (not shown) are formed over a hard mask layer. Afterwards, one or more etching processes are performed to transfer the pattern of the photoresist layers to the hard mask layer, resulting in the formation the hard mask 106.

In some embodiments, an etching process including multiple etching operations are used to pattern the gate electrode layer 104 and the gate dielectric layer 102 to form multiple gate stacks. For example, an etching operation is performed to partially remove an upper portion 105U of the gate electrode layer 104. Afterwards, another etching operation is performed to partially remove a lower portion 105L of the gate electrode layer 104.

Figure 1C:
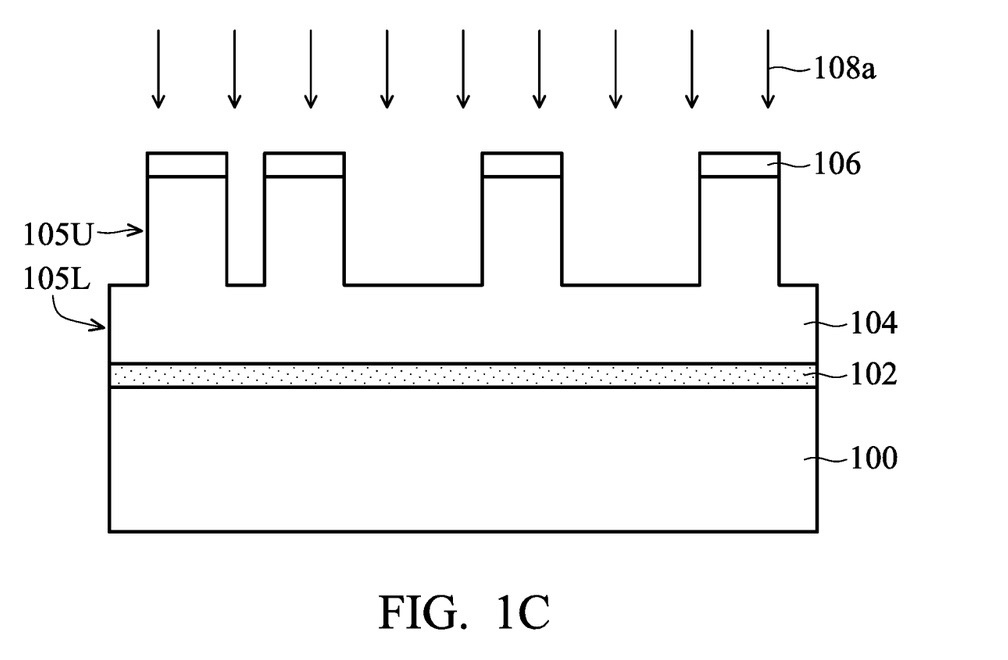

As shown in FIG. 1C, the upper portion 105U of the gate electrode layer 104 is partially removed by a first etching operation 108a, in accordance with some embodiments. In some embodiments, portions of the upper portion 105U not covered by the hard mask 106 are removed. The first etching operation 108a may be performed in a process chamber. In some embodiments, the reaction gas and/or liquid used in the first etching operation includes $Cl_2$, $SF_6$, $N_2$, $CF_4$, $CHF_3$, $CH_2F_2$, $N_2H_2$, $O_2$, He, another suitable compound, or a combination thereof. The pressure of the process chamber may be maintained in a range from about 1 mTorr to about 40 mTorr. The temperature of the first etching operation 108a may be maintained at a temperature in a range from about 10 degrees C. to about 50 degrees C. The power of bias used in the first etching operation 108a may be in a range from about 100 W to about 1000 W.

Figure 1D:
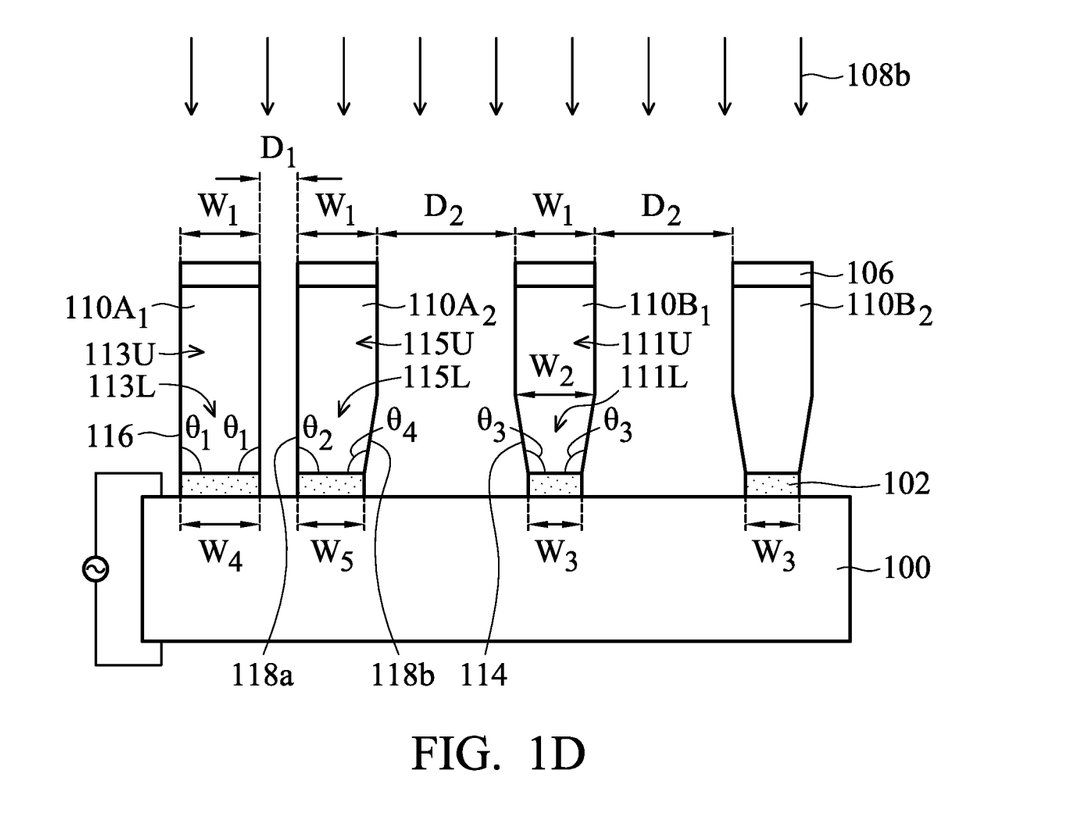

As shown in FIG. 1D, the lower portion 105L of the gate electrode layer 104 is partially removed by a second etching operation 108b, in accordance with some embodiments. In some embodiments, the gate dielectric layer 102 is also patterned. Another etching operation may then be performed to pattern the gate dielectric layer 102. As a result, multiple gate stacks including gate electrodes $110A_1$, $110A_2$, $110B_1$, and $110B_2$ and the gate dielectric layer 102 are formed. In some embodiments, the gate electrodes $110A_1$ and $110A_2$ are formed in a region of the semiconductor substrate 100 where the density of gate electrodes is relatively high. The gate electrodes $110B_1$ and $110B_2$ are formed in another region of the semiconductor substrate 100 where the density of the gate electrodes is relatively low.

As shown in FIG. 1D, the gate electrode $110A_2$ is separated from the gate electrode $110A_1$ by a distance $D_1$. In some embodiments, the distance $D_1$ is in a range from about 5 nm to about 100 nm. As shown in FIG. 1D, the gate electrode 110A2 is separated from the gate electrode 110B1 by a distance D2. In some embodiments, the gate electrode 110B1 is also separated from the gate electrode 110B2 by a distance that is substantially equal to the distance D2. The distance between the gate electrodes 110B1 and 110B2 is also denoted as D2. In some embodiments, the distance D2 is greater than the distance D1. The distance D2 may be in a range from about 150 nm to about 5000 nm.

In some embodiments, the second etching operation 108b and the first etching operation 108a are performed in the same process chamber. The process chamber may be vacuumed to remove the reaction gas and/or liquid used in the first etching operation 108a before the second etching operation 108b is performed.

In some embodiments, the reaction gas and/or liquid used in the second etching operation 108b includes Cl2, BCl3, N2, CF4, CHF3, CH2F2, N2H2, O2, another suitable compound, or a combination thereof. The pressure of the process chamber may be maintained in a range from about 1 mTorr to about 10 mTorr. The temperature of the second etching operation 108b may be maintained at a temperature ranging from about 10 degrees C. to about 50 degrees C. The power of bias used in the second etching operation 108b may be in a range from about 100 W to about 1000 W.

In some embodiments, a voltage is applied to the semiconductor substrate 100 during the second etching operation 108b, as shown in FIG. 1D. Therefore, the etchant used in the second etching operation 108b may be attracted or controlled to mainly etch the lower portion 105L of the gate electrode layer 104. The upper portion 105U of the gate electrode layer 104 may substantially maintain the profile which has been formed in the first etching operation 108a.

In some embodiments, the voltage applied to the semiconductor substrate 100 is an alternating current voltage. In some other embodiments, the voltage applied to the semiconductor substrate 100 is a direct current voltage. In some embodiments, the voltage is applied to the semiconductor substrate 100 intermittently. In some embodiments, the application of the voltage is temporarily stopped to allow a protection layer (not shown) to be formed over sidewalls of the upper portions of the gate electrodes. In some embodiments, some reaction gas and/or liquid used in the second etching operation 108b may cause the formation of the protection layer. Because the application of the voltage is temporarily stopped, there is sufficient time for the etchant to distribute around the gate electrodes more evenly. The etching rate difference between different gate electrodes is lowered. Afterwards, the voltage is applied again to further remove the lower portions of the gate electrodes. During the removal of the lower portions of the gate electrodes, the protection layer may protect the upper portions of the gate electrodes to maintain the gate profiles.

In some embodiments, because the upper portions of the gate electrodes are protected, it is easier to control the etching operation to ensure the gate electrode layer 104 between adjacent gate electrodes are completely removed. As shown in FIG. 1D, the lower portions of some of the gate electrodes such as the gate electrodes 110A2, 110B1, and 110B2 are recessed, in accordance with some embodiments. Therefore, short circuiting is significantly prevented from between the adjacent gate electrodes. Residue is also prevented from being formed between the adjacent gate electrodes. The quality and reliability of the semiconductor device are improved.

In the second etching operation 108b, various process parameters may be adjusted to control the profiles of the gate electrodes. In some embodiments, various etchants are used in combination in the second etching operation 108b. For example, $Cl_2$ is used as a first etchant, and $CHF_3$ and/or $CH_2F_2$ are/is used as a second etchant. In some embodiments, by tuning the ratio of the amount of the first etchant to the second etchant, the profiles of the gate electrodes are controlled. For example, by raising the component of the first etchant, the lateral etching rate may be increased. As a result, the bottom portion of the gate electrodes may be more recessed. Other process parameters such as the applied voltage may also be adjusted to control the profile of the gate electrodes.

As shown in FIG. 1D, the gate electrode $110B_1$ has an upper portion 111U and a lower portion 111L. In some embodiments, the upper portion 111U is wider than the lower portion 111L. As shown in FIG. 1D, the gate electrode $110B_1$ has a width $W_1$ near the top of the gate electrode $110B_1$. The gate electrode $110B_1$ also has a width $W_3$ near the bottom of the gate electrode $110B_1$. The gate electrode $110B_1$ further has a portion having a width $W_2$ between the upper portion 111U and the lower portion 111L. In some embodiments, the width $W_1$ is greater than the width $W_3$. The width $W_2$ is greater than the width $W_3$.

In some embodiments, the lower portion 111L of the gate electrode $110B_1$ has a sidewall 114, which is a slanted sidewall. In some embodiments, the lower portion 111L of the gate electrode $110B_1$ gradually shrinks along a direction towards the semiconductor substrate 100, as shown in FIG. 1D. As shown in FIG. 1D, an angle $\theta_3$ is between the sidewall 114 of the lower portion 111L and the bottom of the gate electrode 110B1. In some embodiments, the angle $\theta_3$ is in a range from about 90 degrees to about 130 degrees.

As shown in FIG. 1D, the gate electrode $110A_1$ has an upper portion 113U and a lower portion 113L. In some embodiments, the upper portion 113U is substantially as wide as the lower portion 113L. The lower portion 113L has a width $W_4$ near the bottom of the gate electrode $110A_1$. In some embodiments, the width $W_4$ is substantially equal to the width $W_1$. In some embodiments, the width $W_4$ of the lower portion 113L of the gate electrode $110A_1$ is greater than the width $W_3$ of the lower portion 111L of the gate electrode $110B_1$.

As shown in FIG. 1D, the lower portion 113L has a sidewall 116. An angle $\theta_1$ is between the sidewall 116 of the bottom of the gate electrode $110A_1$. In some embodiments, the angle $\theta_3$ between the sidewall 114 and the bottom of the gate electrode $110B_1$ is greater than the angle $\theta_1$ between the sidewall 116 and the bottom of the gate electrode $110A_1$. Since the distance $D_2$ is greater than the distance $D_1$, the etchant used in the etching process for forming the gate electrodes may reach and etch the bottom portion of the gate electrode $110B_1$ more easily. As a result, the bottom portion 111L of the gate electrode $110B_1$ is more deeply recessed when compared with that of the gate electrode 110A1. In some embodiments, the angle $\theta 1$ is in a range from about 90 degrees to about 125 degrees. In some embodiments, the sidewall 116 of the gate electrode 110A1 is a substantially vertical sidewall. In these cases, the angle $\theta_1$ is substantially equal to about 90 degrees.

In some embodiments, each of the gate electrodes $110A_1$, $110B_1$, and $110B_2$ has symmetric sidewalls. In some embodiments, the gate electrode $110B_1$ has two symmetric sidewalls 114 which are slanted. The angles between the bottom of the gate electrode $110B_1$ and the opposite sidewalls 114 are substantially the same. Similarly, the gate electrode $110A_1$ has two symmetric sidewalls 116 which are substantially vertical sidewalls.

However, embodiments of the disclosure are not limited thereto. In some embodiments, the gate electrode has asymmetric sidewalls. As shown in FIG. 1D, the gate electrode $110A_2$ has an upper portion 115U and a lower portion 115L. The lower portion 115L has a first sidewall 118a and a second sidewall 118b. The first sidewall 118a is between the second sidewall 118b and the gate electrode $110A_1$. In some embodiments, the first sidewall 118a and the second sidewall 118b are asymmetric sidewalls, as shown in FIG. 1D. As shown in FIG. 1D, the lower portion 115L has a width $W_5$ near the bottom of the gate electrode $110A_2$. In some embodiments, the width $W_5$ is greater than the width $W_3$ of the gate electrode $110B_1$ and smaller than the width $W_4$ of the gate electrode $110A_1$.

As shown in FIG. 1D, an angle $\theta_2$ is between the first sidewall 118a and the bottom of the gate electrode $110A_2$, and an angle $\theta_4$ is between the second sidewall 118b and the bottom of the gate electrode $110A_2$. In some embodiments, the angle $\theta_4$ is greater than the angle $\theta_2$, as shown in FIG. 1D. In some embodiments, the angle $\theta_2$ is substantially equal to the angle $\theta_1$ of the gate electrode $110A_1$. In some embodiments, the angle $\theta_4$ is substantially equal to the angle $\theta_3$ of the gate electrode $110B_1$.

Figure 1E:
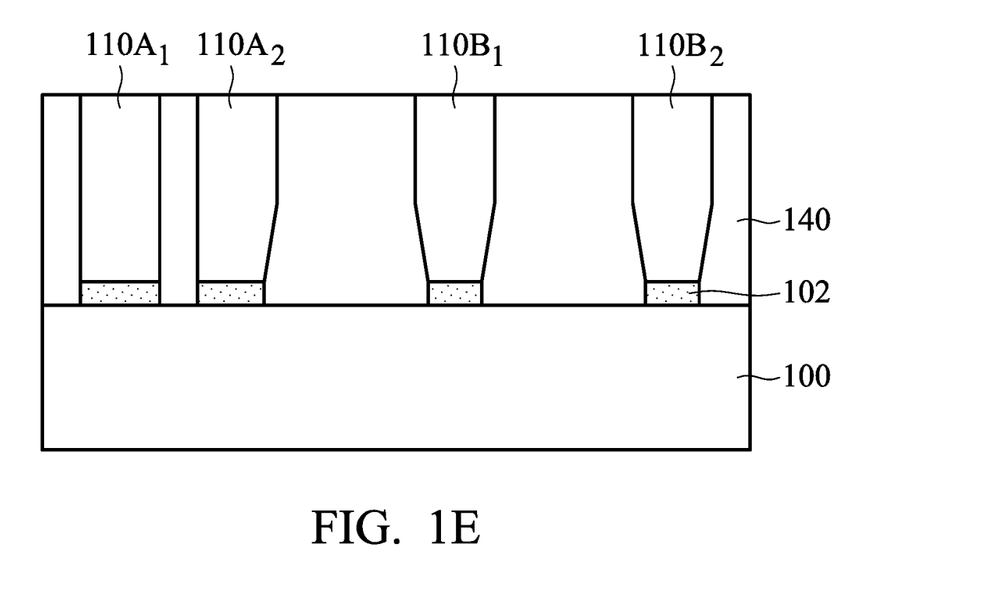

In some embodiments, the gate electrodes and the gate dielectric layer 102 are dummy gate electrodes and a dummy gate dielectric layer and will be replaced in subsequent processes. As shown in FIG. 1E, a dielectric layer 140 is deposited over the semiconductor substrate 100 to surround the gate electrodes $110A_1$, $110A_2$, $110B_1$, and $110B_2$, in accordance with some embodiments. The dielectric layer 140 may be made of silicon oxide, silicon oxynitride, borosilicate glass (BSG), phosphoric silicate glass (PSG), borophosphosilicate glass (BPSG), fluorinated silicate glass (FSG), a low-k material, a porous dielectric material, another suitable dielectric material, or a combination thereof. In some embodiments, the dielectric layer 140 is deposited using a CVD process, a spin-on process, another applicable process, or a combination thereof.

In some embodiments, spacers (not shown) are formed over sidewalls of the gate electrodes before the formation of the dielectric layer 140. The spacers may be used to protect the gate electrodes and assist in the formation of source/drain features (not shown).

In some embodiments, the dielectric layer 140 originally covers the gate electrodes and the hard mask 106 over the gate electrodes. Afterwards, a planarization process is performed on the dielectric layer 140 to thin down the dielectric layer 140 until the gate electrodes $110A_1$, $110A_2$, $110B_1$, and $110B_2$ are exposed. The hard mask 106 may also be removed during the planarization process. The planarization process may include a chemical mechanical polishing (CMP) process, a grinding process, an etching process, another applicable process, or a combination thereof.

Figure 1F:
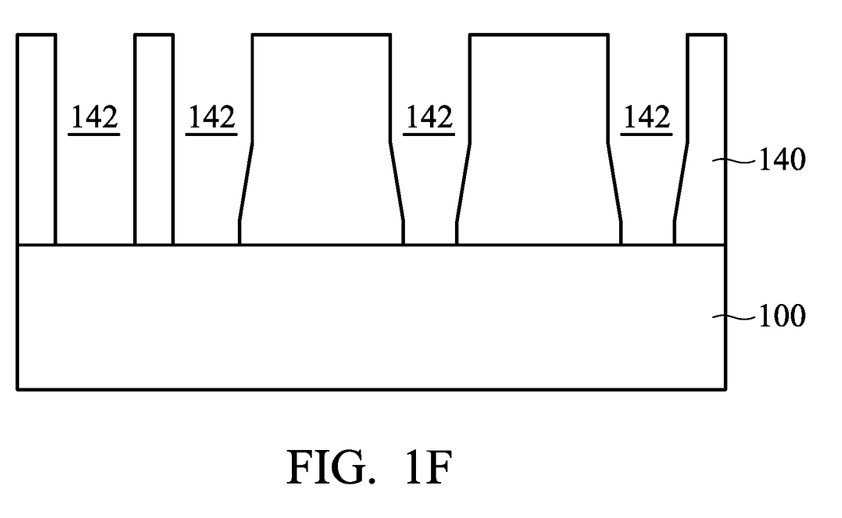

As shown in FIG. 1F, the gate electrodes $110A_1$, $110A_2$, $110B_1$, and $110B_2$ and the gate dielectric layer 102 are removed to form recesses 142 in the dielectric layer 140, in accordance with some embodiments. In some embodiments, the gate electrodes $110A_1$, $110A_2$, $110B_1$, and $110B_2$ and the gate dielectric layer 102 are removed using an etching process. In some other embodiments, the gate dielectric layer 102 is not removed.

Figure 1G:
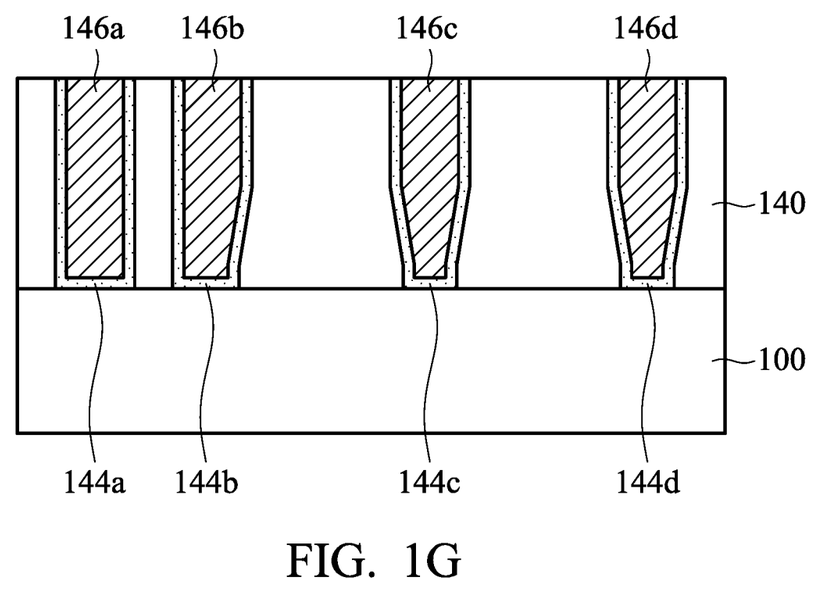

As shown in FIG. 1G, gate dielectric layers 144a, 144b, 144c, and 144d are formed in the recesses 142 to replace the gate dielectric layer 102, in accordance with some embodiments. In some embodiments, the gate dielectric layers 144a, 144b, 144c, and 144d are patterned from the same dielectric layer, and are thus made of the same material. In some other embodiments, some of the gate dielectric layers 144a, 144b, 144c, and 144d are made of different materials. In some embodiments, the gate dielectric layers 144a, 144b, 144c, and 144d are made of a dielectric material with high dielectric constant (high-K). Examples of the high-K dielectric material include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

As shown in FIG. 1G, metal gate electrodes 146a, 146b, 146c, and 146d are formed in the recesses 142 to respectively replace the gate electrodes $110A_1$, $110A_2$, $110B_1$, and $110B_2$, in accordance with some embodiments. The profiles of the metal gate electrodes 146a, 146b, 146c, and 146d are substantially the same as those of the gate electrodes $110A_1$, $110A_2$, $110B_1$, and $110B_2$, respectively. In some embodiments, each of the metal gate electrodes 146a, 146b, 146c, and 146d includes multiple metal layers. Each of the metal gate electrodes 146a, 146b, 146c, and 146d may include one or more work function layers (not shown), one or more barrier layers (not shown), and one or more metal filling layers.

The work function layer is used to provide desired work function for transistors to enhance device performance. In the embodiments of forming an NMOS transistor, the work function layer can be an n-type metal layer capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, other suitable materials, or a combination thereof.

On the other hand, in the embodiments of forming a PMOS transistor, the work function layer can be a p-type metal layer capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be tuned to adjust the work function level. For example, a titanium nitride layer may be used as a p-type metal layer or an n-type metal layer, depending on the thickness and/or the compositions of the titanium nitride layer.

In some embodiments, one or more gate dielectric layers and one or more metal layers for forming the metal gate electrodes are deposited over the dielectric layer 140 and sidewalls and bottoms of the recesses 142. These layers may be sequentially deposited using suitable deposition processes. The deposition processes may include a CVD process, an ALD process, an electroplating process, an electroless plating process, a spin-on process, another applicable process, or a combination thereof.

As shown in FIG. 1F, the sidewalls of the lower portions the recesses 142 are slanted or vertical. The profiles of the recesses 142 may allow the deposition of the gate dielectric layers and metal layers to be performed more easily. Afterwards, a planarization process is performed to remove the gate dielectric layers and the metal layers outside of the recesses 142, resulting in the formation of the metal gate stacks, as shown in FIG. 1G.

Many variations and modifications can be made to embodiments of the disclosure. For example, the condition of the etching process for forming the gate electrodes may be tuned to control the profile of the gate electrodes. Therefore, the profiles of the gate electrodes $110A_1$, $110A_2$, $110B_1$, and $110B_2$ and the corresponding metal gate electrodes 146a, 146b, 146c, and 146d have many variations.

Figure 2A:
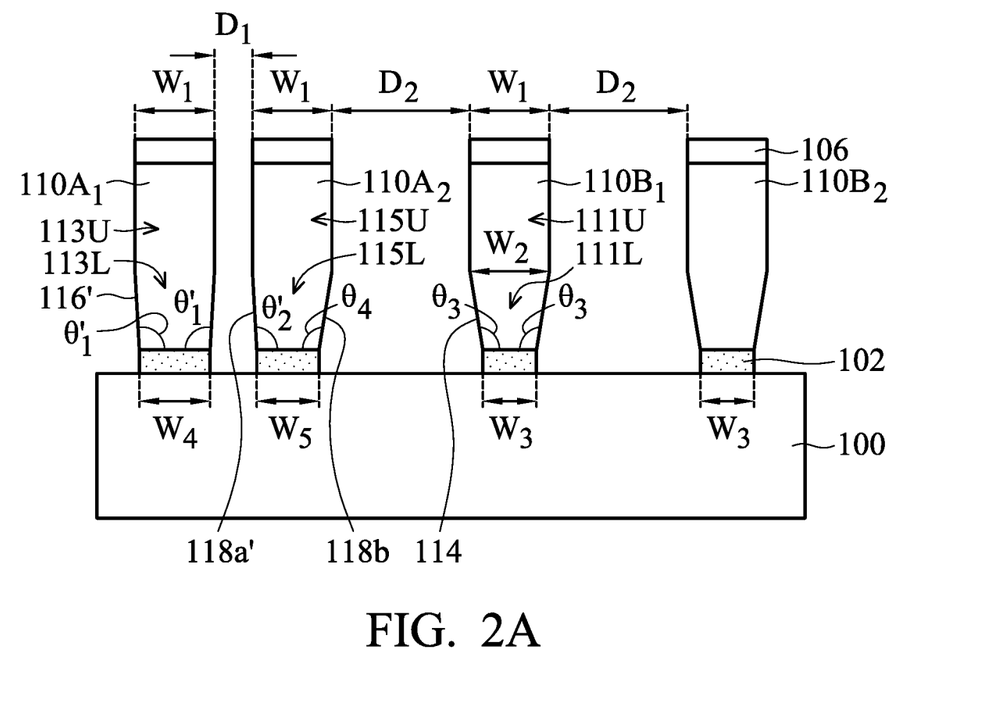
FIG. 2A is a cross-sectional view of a semiconductor device, in accordance with some embodiments.
Figure 2B:
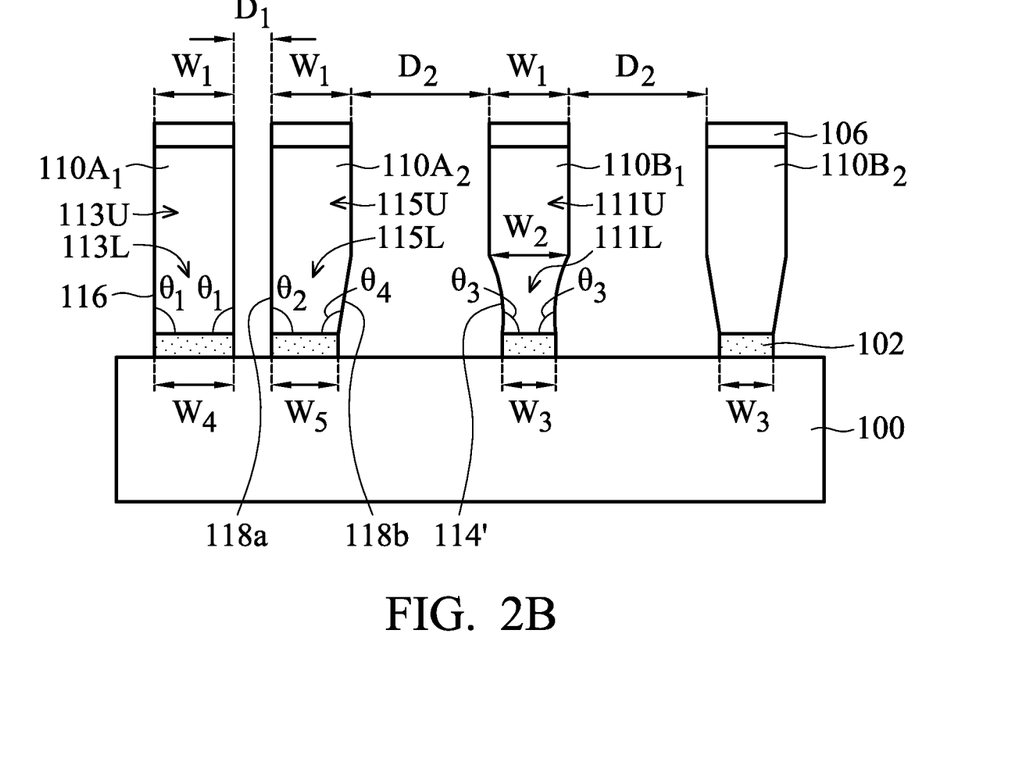
FIG. 2B is a cross-sectional view of a semiconductor device, in accordance with some embodiments.
Figure 2C:
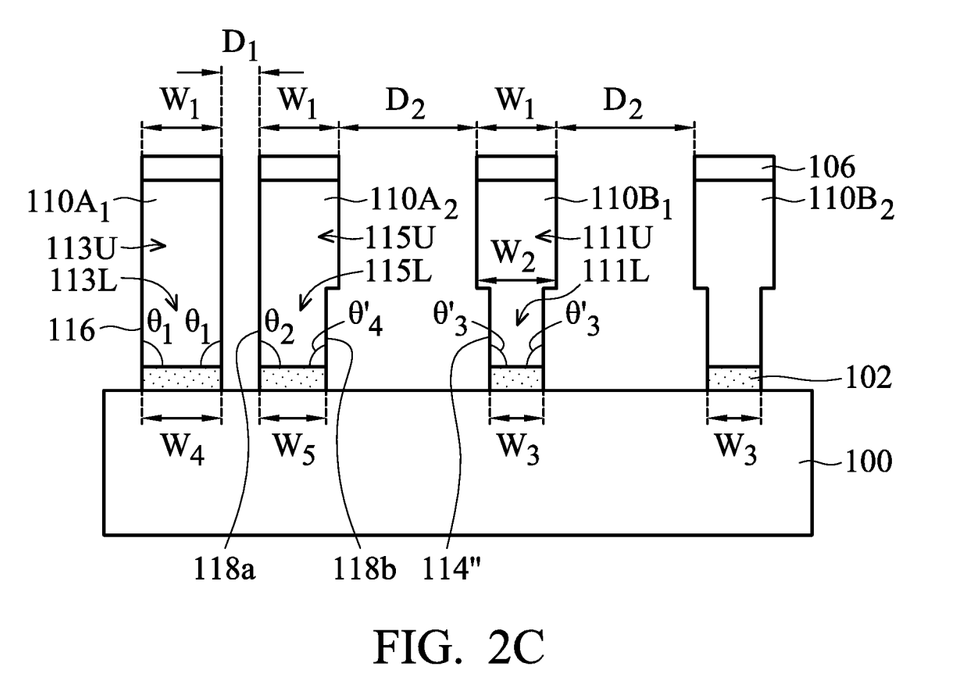
FIG. 2C is a cross-sectional view of a semiconductor device, in accordance with some embodiments.

FIGS. 2A-2C are cross-sectional views of a semiconductor device, in accordance with some embodiments. As shown in FIG. 2A, the lower portion 113L of the gate electrode $110A_1$ has a sidewall 116' which is slanted. The angle $\theta_1'$ between the sidewall 116' and the bottom of the gate electrode 110A$_1$ is greater than 90 degrees. For example, the angle $\theta_1'$ is in a range from about 95 degrees to about 125 degrees. In some embodiments, the width W$_4$ near the bottom of the gate electrode 110A$_1$ is smaller than the width W$_1$ near the top of the gate electrode 110A$_1$, as shown in FIG. 2A. In other words, the upper portion 113U is wider than the lower portion 113L in some embodiments.

As shown in FIG. 2A, the gate electrode 110A$_2$ has a sidewall 118a' which is slanted. An angle $\theta_2'$ is between the sidewall 118a' and the bottom of the gate electrode 110A$_2$. In some embodiments, the angle $\theta_2'$ is greater than 90 degrees. The angle $\theta_2'$ may be in a range from about 95 degrees to about 125 degrees. In some embodiments, the angle $\theta_2'$ is substantially equal to the angle $\theta_1'$ and smaller than the angle $\theta_4$ or the angle $\theta_3$ of the gate electrode 110B$_1$.

Embodiments of the disclosure have many variations. For example, the sidewall of the gate electrode is not limited to being planar. In some embodiments, the sidewall of the gate electrode is curved. By tuning the etching condition, a gate electrode having curved sidewalls can be formed. As shown in FIG. 2B, the lower portion 111L of the gate electrode 110B$_1$ has a sidewall 114'. In some embodiments, the sidewall 114' is a curved sidewall. In some embodiments, the lower portion of the gate electrode 110B$_2$ also has a curved sidewall. In some other embodiments, the sidewall of the lower portion of the gate electrode 110B$_2$ is not curved. In some other embodiments, the gate electrodes 110A$_1$ and/or 110A$_2$, which are separated from each other by a smaller distance, also have/has curved sidewalls.

Embodiments of the disclosure have many variations. The sidewalls of the recessed lower portion of the gate electrode are not limited to being slanted or curved. In some embodiments, the sidewalls of the recessed lower portion of the gate electrode are substantially vertical sidewalls. As shown in FIG. 2C, the lower portion 111L of the gate electrode 110B$_1$ has a sidewall 114". In some embodiments, the sidewall 114" is a vertical sidewall. In these cases, the angle $\theta_3'$ between the sidewall 114" and the bottom of the gate electrode 110B$_1$ is substantially equal to about 90 degrees. As shown in FIG. 2C, the sidewall 118b of the gate electrode 110A$_2$ is also a vertical sidewall, in accordance with some embodiments. In these cases, the angle $\theta_4'$ between the sidewall 118b and the bottom of the gate electrode 110A$_2$ is substantially equal to about 90 degrees.

Embodiments of the disclosure form a semiconductor device with multiple gate electrodes. By tuning the condition of the etching process for forming the gate electrodes, the bottom portions of some of the gate electrodes are recessed. Due to the gate profiles, short circuiting is significantly prevented between adjacent gate electrodes. Residue is also prevented from being formed between the adjacent gate electrodes. The quality and reliability of the semiconductor device are improved.

In accordance with some embodiments, a semiconductor device is provided. The semiconductor device includes a semiconductor substrate and a first gate electrode over the semiconductor substrate. The semiconductor device also includes a first gate dielectric layer between the first gate electrode and the semiconductor substrate. The semiconductor device further includes a second gate electrode over the semiconductor substrate. The second gate electrode has an upper portion and a lower portion between the upper portion and the semiconductor substrate, and the upper portion is wider than the lower portion. In addition, the semiconductor device includes a second gate dielectric layer between the second gate electrode and the semiconductor substrate.

In accordance with some embodiments, a semiconductor device is provided. The semiconductor device includes a semiconductor substrate and a first gate electrode over the semiconductor substrate. The semiconductor device also includes a first gate dielectric layer between the first gate electrode and the semiconductor substrate. The semiconductor device further includes a second gate electrode over the semiconductor substrate. A lower portion of the second gate electrode gradually shrinks along a direction towards the semiconductor substrate. In addition, the semiconductor device includes a second gate dielectric layer between the second gate electrode and the semiconductor substrate.

In accordance with some embodiments, a method for forming a semiconductor device is provided. The method includes forming a gate electrode layer over a semiconductor substrate. The method also includes partially removing the gate electrode layer to form multiple gate electrodes by an etching process. A lower portion of one of the gate electrodes is recessed during the etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first gate dielectric over a substrate;
   a first gate electrode over the first gate dielectric, the first gate electrode having a first sidewall forming a first angle with a first plane and a second sidewall forming the first angle with the first plane, the first plane parallel to a top surface of the substrate;
   a second gate dielectric over the substrate;
   a second gate electrode over the second gate dielectric, the second gate electrode having a third sidewall forming the first angle with the first plane and a fourth sidewall forming a second angle with the first plane, the second angle different from the first angle;
   a third gate dielectric over the substrate;
   a third gate electrode over the third gate dielectric, the third gate electrode having a fifth sidewall forming the second angle with the first plane and a sixth sidewall forming the second angle with the first plane; and
   a dielectric layer surrounding the first gate electrode, the second gate electrode, and the third gate electrode.

2. The device of claim 1, wherein the first gate electrode is separated from the second gate electrode by a first distance, and the second gate electrode is separated from the third gate electrode by a second distance, the second distance different from the first distance.

3. The device of claim 2, wherein the second distance is greater than the first distance and the second angle is greater than the first angle.

4. The device of claim 1, wherein the first angle is a first obtuse angle and the second angle is a second obtuse angle, the first obtuse angle in a range of 90 degrees to 125 degrees, the second obtuse angle in a range of 90 degrees to 130 degrees.

5. The device of claim 1, wherein the first angle is a right angle and the second angle is an obtuse angle, the obtuse angle in a range of 90 degrees to 130 degrees.

6. The device of claim 1, wherein the first sidewall, the second sidewall, the third sidewall, the fourth sidewall, the fifth sidewall, and the sixth sidewall are each planar.

7. The device of claim 1, wherein the first sidewall, the second sidewall, the third sidewall, the fourth sidewall, the fifth sidewall, and the sixth sidewall are each curved.

8. The device of claim 1, wherein the first sidewall, the second sidewall, the third sidewall, the fourth sidewall, the fifth sidewall, and the sixth sidewall are each stepped.

9. A device comprising:
   a first gate dielectric over a substrate;
   a first gate electrode over the first gate dielectric, the first gate electrode having a first upper width and a first lower width, the first upper width greater than the first lower width;
   a second gate dielectric over the substrate;
   a second gate electrode over the second gate dielectric, the second gate electrode having a second upper width and a second lower width, the second upper width greater than the second lower width, the second lower width less than the first lower width;
   a third gate dielectric over the substrate;
   a third gate electrode over the third gate dielectric, the third gate electrode having a third upper width and a third lower width, the third upper width greater than the third lower width, the third lower width less than the second lower width; and
   a dielectric layer surrounding the first gate electrode, the second gate electrode, and the third gate electrode.

10. The device of claim 9, wherein the first upper width, the second upper width, and the third upper width are the same width.

11. The device of claim 9, wherein the first gate electrode is separated from the second gate electrode by a first distance, and the second gate electrode is separated from the third gate electrode by a second distance, the second distance greater than the first distance.

12. The device of claim 9, wherein the first gate electrode, the second gate electrode, and the third gate electrode each have planar sidewalls.

13. The device of claim 9, wherein the first gate electrode, the second gate electrode, and the third gate electrode each have curved sidewalls.

14. The device of claim 9, wherein the first gate electrode, the second gate electrode, and the third gate electrode each have stepped sidewalls.

15. A device comprising:
   a plurality of first gate stacks over a first region of a substrate, each of the first gate stacks spaced apart from one another by a first distance, each of the first gate stacks comprising a first gate electrode and a first gate dielectric, the first gate dielectric extending along first sidewalls of the first gate electrode;
   a plurality of second gate stacks over a second region of the substrate, each of the second gate stacks spaced apart from one another by a second distance, the second distance different from the first distance, each of the second gate stacks comprising a second gate electrode and a second gate dielectric, the second gate dielectric extending along second sidewalls of the second gate electrode; and
   a dielectric layer around the first gate stacks and the second gate stacks.

16. The device of claim 15, wherein the first gate electrode of each of the first gate stacks has a first upper width and a first lower width, and the second gate electrode of each of the second gate stacks has a second upper width and a second lower width, the first upper width greater than the first lower width, the second upper width greater than the second lower width.

17. The device of claim 15, wherein the first sidewalls form a first angle with a first plane and the second sidewalls form a second angle with the first plane, the second angle different from the first angle, the first plane parallel to a top surface of the substrate.

18. The device of claim 15, wherein the first sidewalls are planar, and the second sidewalls are planar.

19. The device of claim 15, wherein the first sidewalls are curved, and the second sidewalls are curved.

20. The device of claim 15, wherein the first sidewalls are stepped, and the second sidewalls are stepped.

* * * * *